United States Patent
Sohn et al.

(10) Patent No.: US 9,627,015 B2
(45) Date of Patent: Apr. 18, 2017

(54) MEMORY DEVICE HAVING PAGE STATE INFORMING FUNCTION

(71) Applicants: Young-soo Sohn, Seoul (KR); Kwang-il Park, Yongin-si (KR); Sei-jin Kim, Yongin-si (KR); Tae-young Kim, Seoul (KR)

(72) Inventors: Young-soo Sohn, Seoul (KR); Kwang-il Park, Yongin-si (KR); Sei-jin Kim, Yongin-si (KR); Tae-young Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/852,890

(22) Filed: Sep. 14, 2015

(65) Prior Publication Data
US 2016/0148654 A1    May 26, 2016

(30) Foreign Application Priority Data
Nov. 24, 2014  (KR) .................. 10-2014-0164416

(51) Int. Cl.
G11C 7/00       (2006.01)
G11C 7/10       (2006.01)

(52) U.S. Cl.
CPC ............ *G11C 7/109* (2013.01); *G11C 7/1063* (2013.01); *G11C 2207/2272* (2013.01)

(58) Field of Classification Search
CPC .................. G11C 7/109; G11C 7/1063; G11C 2207/2272
USPC ................... 365/189.07, 49, 191, 235, 238.5
See application file for complete search history.

(56) References Cited

U.S. PATENT DOCUMENTS

| | | | | |
|---|---|---|---|---|
| 5,848,025 A | * | 12/1998 | Marietta | G11C 7/1072 365/238.5 |
| 5,889,714 A | | 3/1999 | Schumann et al. | |
| 6,002,632 A | * | 12/1999 | Krueger | G11C 8/00 365/191 |
| 6,199,138 B1 | * | 3/2001 | Jeddeloh | G06F 12/0215 365/193 |
| 6,310,816 B2 | * | 10/2001 | Manning | 365/189.05 |

(Continued)

OTHER PUBLICATIONS

Rajinder Gill, Everything You Always Wanted to Know About SDRAM (Memory): But Were Afraid to Ask, Memory Guides Intel, Aug. 15, 2010, pp. 4.

*Primary Examiner* — Tan T. Nguyen
(74) *Attorney, Agent, or Firm* — Harness, Dickey & Pierce, P.L.C.

(57) ABSTRACT

A memory device, system, and/or method are provided for performing a page state informing function. The memory device may compare one or more row addresses received along with a command, determine the page open/close state according to a page hit or miss generated as a result of comparison, count read or write commands with respect to pages corresponding to a same row address, and determine the page open/close state according to a read or write command number generated as a result of counting. The memory device may determine a page open/close state with respect to a corresponding page based on a page hit/miss and a read or write command number and output a flag signal. The memory device may provide the page open/close state for each channel. A memory controller may establish different page open/close policies for each channel.

18 Claims, 13 Drawing Sheets

(56) References Cited

U.S. PATENT DOCUMENTS

| | | | |
|---|---|---|---|
| 6,374,323 | B1 | 4/2002 | Stracovsky et al. |
| 6,785,793 | B2 | 8/2004 | Aboulenein et al. |
| 7,054,999 | B2 * | 5/2006 | Bains .................. G06F 12/0864 |
| | | | 365/230.02 |
| 7,076,617 | B2 | 7/2006 | Dodd |
| 7,099,976 | B2 | 8/2006 | Kim |
| 7,679,133 | B2 | 3/2010 | Son et al. |
| 7,761,656 | B2 | 7/2010 | Madrid et al. |
| 7,778,103 | B2 | 8/2010 | Song et al. |
| 8,200,882 | B2 | 6/2012 | Tanaka et al. |
| 8,347,020 | B2 | 1/2013 | Maddali et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,688,942 | B2 | 4/2014 | Kim et al. |
| 2008/0282029 | A1 | 11/2008 | Balakrishnan et al. |
| 2011/0055495 | A1 * | 3/2011 | Wolford .............. G06F 13/1694 |
| | | | 711/154 |
| 2011/0233648 | A1 | 9/2011 | Seol et al. |
| 2012/0099389 | A1 * | 4/2012 | Park .................. G11C 11/40618 |
| | | | 365/200 |
| 2015/0117100 | A1 * | 4/2015 | Park .................... G11C 16/225 |
| | | | 365/185.03 |
| 2015/0143020 | A1 * | 5/2015 | Ferreira ................... G11C 8/12 |
| | | | 711/102 |

* cited by examiner

MEMORY DEVICE HAVING PAGE STATE INFORMING FUNCTION

CROSS-REFERENCE TO RELATED APPLICATION

This application claims the benefit of Korean Patent Application No. 10-2014-0164416, filed on Nov. 24, 2014, in the Korean Intellectual Property Office, the disclosure of which is incorporated herein in its entirety by reference.

BACKGROUND

The inventive concepts relate to a semiconductor memory device, and more particularly, to a memory device and/or a system for performing a page state informing function and supporting a page management policy of a memory controller in order to allow the memory controller to identify a page state of the memory device.

A system typically includes a processor, a memory device, and a memory controller. The memory controller is provided to allow other components of the system and the processor as well to access the memory device. Performance of the system is influenced by a memory read latency and a memory write latency during an operation of accessing the memory device in response to a read and/or write memory transaction by the processor. The memory read latency and the memory write latency are predominant to the memory controller that determines whether pages of the memory device are in an open state or a closed state. If the memory device is able to inform the memory controller of an open/close state of a page, when the memory controller establishes and/or implement a page management policy, a reference to the open/close state of the page may help in improving the system performance.

SUMMARY

The inventive concepts provide a memory device, a method of operating the memory device, and/or a system for performing a page state informing function and supporting a page management policy of a memory controller in order to allow the memory controller to identify a page state of the memory device.

According to an aspect of the inventive concepts, there is provided a memory device including a memory cell array that may include a plurality of pages addressed by row address, and a control logic unit configured to determine whether at least one page among the plurality of pages is in an open state or a closed state, based on a command and the row address of the at least one page, and the control logic unit configured to output a flag signal indicating whether the at least one page is in the open state or the closed state.

The control logic unit may be configured to generate results based on at least two row addresses received along with a command, generate a page hit or a page miss based on the results, and determine, according to the page hit or the page miss, whether each of the plurality of pages is in the open state or the closed state.

The control logic unit may be configured to count read or write commands with respect to a page corresponding to a row address and determine, according to a read or write command number generated based on the counting, whether each of the plurality of pages is in the open state or the closed state.

The control logic unit may include a register configured to store one or more row addresses received along with a command, a comparator configured to generate results based on at least two row addresses stored in the register and generate a page hit or a page miss, a counter configured to count read or write commands with respect to a page corresponding to a row address and generate a read or write command number; and a logic circuit unit configured to determine, based on the page hit or page miss and the read or write command number, whether each of the plurality of pages is in the open state or the closed state.

The memory cell array may be configured as one or more banks including the plurality of pages, wherein the control logic unit further includes a hit profiler corresponding to each of the one or more banks; and wherein each hit profiler is configured to determine whether each of the plurality of pages of a bank corresponding to said hit profiler is in the open state or the closed state.

Each hit profiler may include: a register configured to store one or more row addresses received along with a command associated with the bank corresponding to said hit profiler; a comparator configured to generate results based on the one or more row addresses stored in the register and generate a page hit or a page miss; and a counter configured to count read or write commands with respect to a page corresponding to a same row address associated with the corresponding bank and generate a read or write command number, wherein the control logic unit further includes a logic circuit unit configured to determine whether the page corresponding to the same row address associated with the corresponding bank are in the open state or the closed state, based on the page hit or the page miss and the generated read or write command number.

The page open state or the closed state may be stored in a multipurpose register (MPR) of a mode register of the memory device.

The flag signal may be output according to a mode register read command.

The flag signal may be output through a data input/output pin of the memory device.

The flag signal may be output through a pin indicating whether the at least one page is in the open state or the closed state.

According to another aspect of the inventive concepts, there is provided a method of operating a memory device that may include a plurality of pages addressed by row addresses, and the method may include receiving a command and the row addresses, determining a page open/close state with respect to the plurality of pages based on the command and the row addresses; and outputting a flag signal, the flag signal indicating the page open/close state.

The determining of the page open/close state may include generating results based on two or more row addresses received along with a command generating a page hit or miss based on the results; and determining the page open/close state according to the page hit or miss.

The number of the row addresses to be compared may be determined according to a desired precision of the generating the page hit or page miss.

The determining of the page open/closed state may include counting read or write commands with respect to pages corresponding to a same row address, and determining the page open/close state according to a read or write command number generated as a result of the counting.

The memory may include one or more banks including the plurality of pages, the method may further include determining the page open/close state with respect to the plurality of pages of a corresponding bank among the one or more banks.

The determining of the page open/close state may include generating results based on two or more row addresses received along with a command associated with the corresponding bank; and determining the page open/close state with respect to the plurality of pages of the corresponding bank according to a page hit or miss generated based on the comparison.

The determining of the page open/close state may include counting read or write commands with respect to the plurality of pages corresponding to a row address associated with the corresponding bank, and determining the page open/close state with respect to the plurality of pages of the corresponding bank according to a read or write command number generated as a result of the counting.

The method may further include storing the page open/close state in an MPR of a mode register of the memory device, and the page open/close state stored in the MPR is output as a flag signal according to a mode register read command.

The flag signal may be output through a data input/output pin of the memory device.

The flag signal may be output through a separate pin indicating the page open/close state.

According to another aspect of the inventive concepts, there is provided a system that may include a memory controller configured to transmit a command and row addresses; a first memory device configured to determine a page open/close state with respect to a first page among a plurality of pages based on the command and the row addresses and outputting the page open/close state to the memory controller as a first flag signal; and a second memory device configured to determine a page open/close state with respect to a second page among a plurality of pages based on the command and the row addresses and output the page open/close state to the memory controller as a second flag signal, wherein the memory controller establishes different page open and page close policies with respect to the first memory device and the second memory device.

The system may include wherein the first memory device is configured to output the first flag signal through a data input/output pin and the second memory device is configured to output the second flag signal through a data input/output pin of the second memory device.

The system may include wherein the first memory device is configured to output the first flag signal output through a pin indicating the page open/close state of the first memory device and the second memory device is configured to output the second flag signal through a pin indicating the page open/close state of the second memory device.

According to another aspect of the inventive concepts, there is provided a system that may include at least one processor configured to read or write (R/W) data to a memory address, at least one memory controller configured to access at least one memory device in accordance to a R/W command from the processor, and the memory device is configured to determine a page state for a page associated with the R/W command, the page state indicating whether the page is in an open or closed stated.

The memory device may include a control logic configured to receive the R/W command from the memory controller, the R/W command including a memory address, determine the page state by determining whether the memory address corresponds to an open page in the memory device, and generate a signal indicating the page state.

The received R/W command may include a plurality of memory addresses, and the control logic may be configured to determine the page state by counting a number of the plurality of memory addresses that correspond to the open page in the memory device, determining whether the number is greater than a desired threshold number, and generating the signal indicating the page state result based on the determining.

The memory controller may include a plurality of memory controllers, the memory device includes a plurality of memory devices, and the plurality of memory devices are each configured to operate as a memory channel.

Each of the memory controllers may be configured to set a page policy for a respective one of the memory devices.

BRIEF DESCRIPTION OF THE DRAWINGS

The foregoing and other features of inventive concepts will be apparent from the more particular description of non-limiting example embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
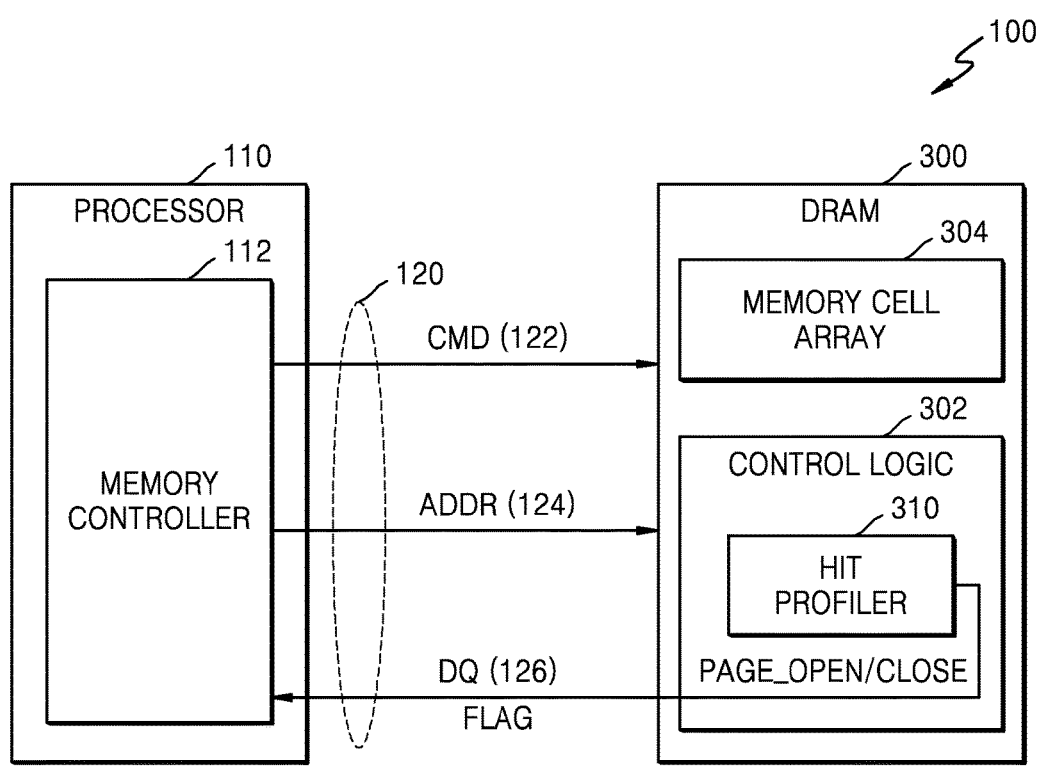
FIG. 1 is a diagram of a first example of explaining a system including a memory device for performing a pages state informing function, according to at least one example embodiment.

Various example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a diagram of a system 100 including a memory device 300 for performing a pages state informing function, according to at least one example embodiment.

Referring to FIG. 1, the system 100 may be configured as a processor 110 and the memory device 300. The processor 110 may allocate program code, i.e., computer readable instructions, that are a set of commands and data to the memory device 300 to execute an application program according to a system use purpose. The processor 110 may include a memory controller 112 that supports a read and/or write memory transaction to access the memory device 300, however it is not limited thereto and the processor 110 and the memory controller 112 may be embodied as separate components and/or devices.

The memory controller 112 may be connected to the memory device 300 via a bus 120. A command CMD, an address ADDR, and data DQ of the memory controller 112 may be transmitted to the memory device 300 via the bus 120. The data DQ output from the memory device 300 or a flag signal FLAG indicating a page open/closed state PAGE_OPEN/CLOSE in response to the command CMD and the address ADDR of the memory controller 112 may be transmitted to the memory controller 112 via the bus 120. The bus 120 may include a command line 122, an address line 124, and a data input/output line (DQ line) 126.

According to at least one example embodiment, the command line 122 and the address line 124 may be implemented in a single line, or multiple lines, in the bus 120 to transmit the command CMD and the address ADDR, and the transmission may be provided in a sequential or parallel manner. According to another example embodiment, the bus 120 may further include a separate signal line transmitting the flag signal FLAG indicating the page open/close state PAGE_OPEN/CLOSE (i.e., the page state) output from the memory device 300 in response to the in response to the command CMD and/or the address ADDR of the memory controller 112, but is not limited thereto.

According to at least one example embodiment, the memory controller 112 may be implemented as a chip separate from the processor 110. The memory controller 112 may perform the memory transaction by a chipset constituting the system 100 other than the processor 110. For example, when the system 100 is configured as a computing device, the chipset may be configured as one or more integrated circuit (IC) packages or chips that connect components such as basic input/output system (BIOS) firmware, a keyboard, a mouse, a storage device, a network interface, etc., to the processor 110. Additionally, while the processor 110 is depicted as a single processor it is not limited thereto and the processor 110 may also be implemented as a multi-core processor, a multiple processor system, a distributed processor system, etc.

The memory device 300 may be configured as various memory devices providing an addressable storage location in which the memory controller 112 may read and/or write data. The memory device 300 may be configured as, for example, a dynamic random access memory (DRAM) device, a synchronous DRAM (SDRAM) device, a double data rate (DDR) SDRAM device, or another memory device.

The memory controller 112 may access the memory device 300 in response to the read and/write memory transaction by the processor 110. An operation of accessing the memory device 300 may be influenced by a memory read latency and a memory write latency.

In general, the memory read latency indicates a time between the time when the processor 110 requests the memory controller 112 to search for and retrieve data from the memory device 300 and the time when the memory controller 112 provides the requested data to the processor 110. The memory write latency indicates a time between the time when the processor 110 requests the memory controller 112 to write data to the memory device 300 and the time when the memory controller 112 informs the processor 110 of having completely written the data to the memory device 300.

In light of the memory read latency and the memory write latency, it may be beneficial for the memory controller 112 to determine whether pages of the memory device are 300 in an open state or a closed state. For example, the memory controller 112 may allow the memory device 300 to close one or more open pages in response to a determination of closing an open page of the memory device 300. Additionally, the memory controller 112 may allow the memory device 300 to open one or more close pages in response to a determination of opening a closed page of the memory device 300.

When the memory controller 112 determines whether the page is open or closed of the memory device 300, the memory controller 112 may be provided with the page open/closed state from the memory device 300, it may be further beneficial to the memory controller 112. Therefore, the memory controller 112 may not need a page manager, such as a complicated page state logic, and may easily establish a page open/closed policy.

The memory device 300 may include a control logic unit 302 that receives the command CMD and the address ADDR from the memory controller 112 and a memory cell array 304. The control logic unit 302 may include a hit profiler 310 that analyzes the command CMD and the address ADDR and determines the page open/closed state with respect to at least one page in the memory cell array 304. The memory cell array 304 may include one or more banks that may be configured as a plurality of memory cell rows (or pages).

The hit profiler 310 may compare one or more row addresses received along with a same command and, as a method of counting commands with respect to pages corresponding to a same row address, may analyze the command CMD and the address ADDR. The hit profiler 310 may determine a page hit or miss (hit/miss) with respect to a corresponding page according to an analyzed result and may generate a read or write command number.

The control logic unit 302 may determine the page open/close state PAGE_OPEN/CLOSE with respect to the corresponding page based on the page hit/miss of the corresponding page or the read or write command number by the hit profiler 310. The memory device 300 may generate the flag signal FLAG according to the page open/close state PAGE_OPEN/CLOSE with respect to the corresponding page.

The memory device 300 may transfer the flag signal FLAG indicating the page open/close state PAGE_OPEN/CLOSE to the memory controller 112 through the DQ line 126. The memory controller 112 may refer to the flag signal FLAG in establishing the page policy. According to at least one example embodiment, the memory device 300 may transfer the flag signal FLAG indicating the page open/close state PAGE_OPEN/CLOSE to the memory controller 112 through a dedicated pin.

Figure 2:
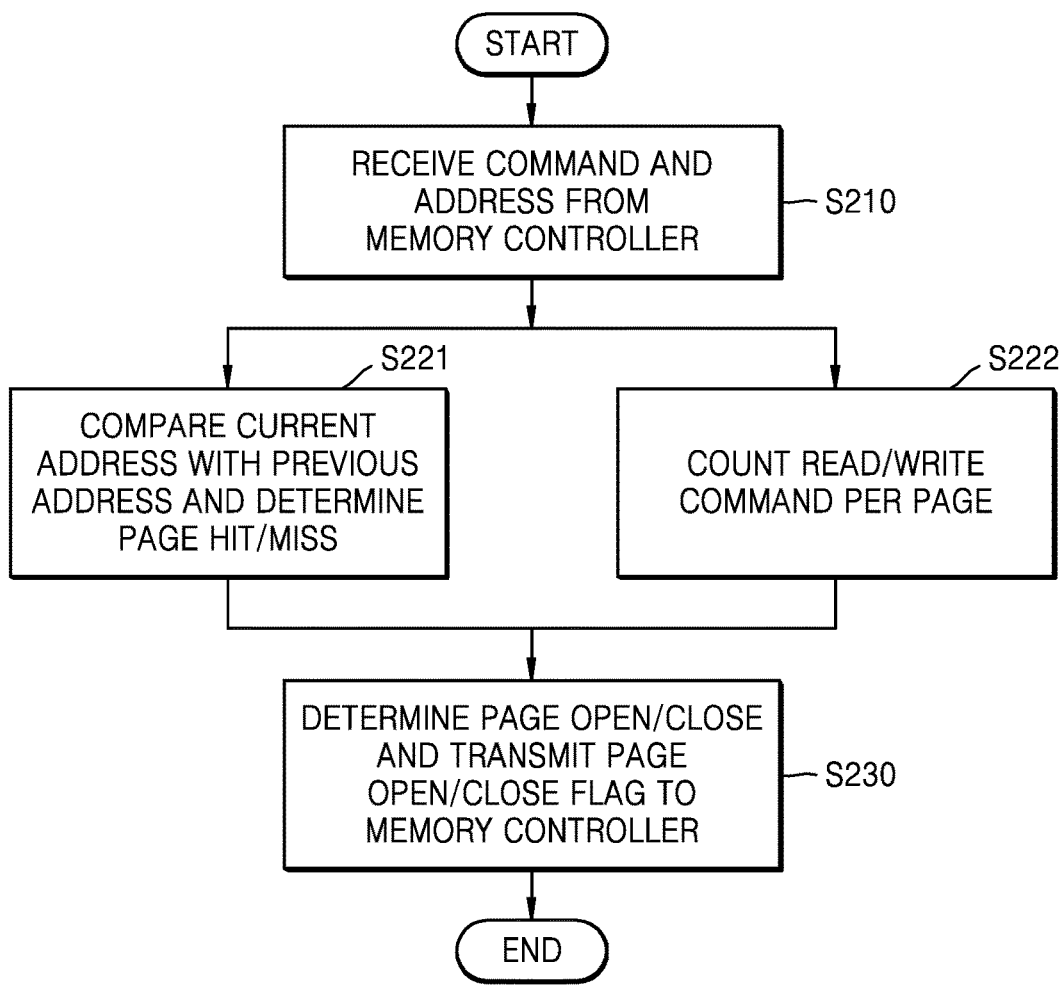
FIG. 2 is a diagram for explaining a method of operating the memory device of FIG. 1, according to at least one example embodiment.

FIG. 2 is a diagram for explaining a method of operating the memory device 300 of FIG. 1 according to at least one example embodiment.

Referring to FIGS. 1 and 2, the memory device 300 may receive the command CMD and the address ADDR from the memory controller 112 (operation S210). The command CMD may include an active command, a read command, a write command, a precharge command, etc. The address ADDR may be configured as a row address and a column address. The row address addresses memory cell rows included in the memory cell array 304, and thus the row address may be referred to as a memory cell row address or a page address. The column address may select data of a memory cell row activated by the row address. The active command may activate a memory cell row corresponding to the row address. The read command and the write command may instruct a read operation and a write operation with respect to the memory cell row. The precharge command may precharge the activated memory cell row.

According to at least one example embodiment, the memory cell array 304 may be configured as a plurality of banks, and the address ADDR may include information such as a bank address, a row address, and/or a column address. The row address may address memory cell rows of a corresponding bank corresponding to the bank address. The column address may select data of a memory cell row activated by the row address of the corresponding bank. The read command may instruct a read operation with respect to the row address of the corresponding bank corresponding to the bank address. The write command may instruct a write operation.

The memory device 300 may store the addresses ADDR received along with the command CMD from the memory controller 112. The memory device 300 may store, for example, row addresses received along with the read command. The memory device 300 may store previous row addresses of the read command and a current row address. According to at least one example embodiment, the memory device 300 may store row addresses received along with the write command.

The memory device 300 may compare the current row address and a previous row address. The memory device 300 may compare the current row address and the previous row address to determine a page hit or miss (hit/miss) (operation S221). The page hit may determine that the current row address and the previous row address are the same. The page miss may determine that the current row address and the previous row address are not same. According to at least one example embodiment, the memory device 300 may compare the current row address and a plurality of previous row addresses to determine the page hit or miss.

The memory device 300 may store the commands CMDs received from the memory controller 112. The memory device 300 may count read commands or write commands with respect to pages corresponding to a same row address (operation S222). Accordingly, the memory device 300 may generate a read command number or a write command number per page.

The memory device 300 may determine the page open/close state PAGE_OPEN/CLOSE with respect to a page corresponding to the row address based on the page hit/miss provided in operation S221 and the read/write command number provided in operation S222 (operation S230). The page open state PAGE_OPEN may indicate that a corresponding page is open by performing the read operation or the write operation. The page close state PAGE_CLOSE may indicate that the corresponding page is closed by not performing the read operation or the write operation.

The memory device 300 may output the determined page open/close state PAGE_OPEN/CLOSE with respect to the page corresponding to the row address received from the memory controller 112 as the flag signal FLAG. For example, the memory device 300 may output the logic high ("1") flag signal FLAG in the page open state PAGE_OPEN, and may output the low high ("0") flag signal FLAG in the page close state PAGE_CLOSE. The memory device 300 may transmit the flag signal FLAG indicating the page open/close state PAGE_OPEN/CLOSE to the memory controller 112 (operation S230). The memory controller 112 may establish a page open/page policy by referring to the flag signal FLAG.

The method of operating the memory device 300 described above determines a page open/close state in the memory device 300 and provides the determined page open/close state to the memory controller 112, and thus the memory controller 112 may easily establish the page open/close policy without a page manager, such as a complicated page state logic.

Figure 3:
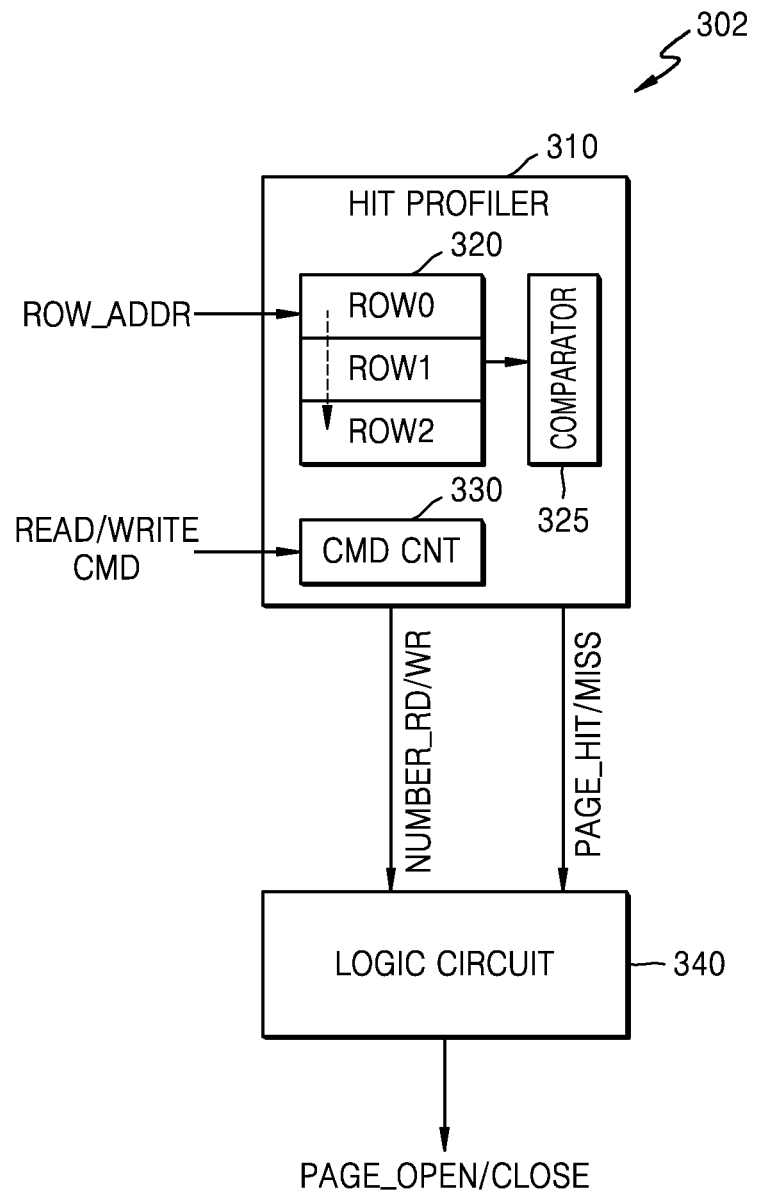
FIG. 3 is a diagram of a first example of explaining a control logic unit included in the memory device of FIG. 1, according to at least one example embodiment.

FIG. 3 is a diagram of a first example of explaining the control logic unit 302 included in the memory device 300 of FIG. 1 according to at least one example embodiment.

Referring to FIG. 3, the control logic unit 302 may include the hit profiler 310 and a logic circuit unit 340. The hit profiler 310 may compare one or more row addresses ROW_ADDR received along with a same command to determine a page hit/miss PAGE_HIT/MISS with respect to a page corresponding to the row address ROW_ADDR. The hit profiler 310 may count a read or write command READ/WRITE with respect to pages corresponding to a same row address to generate a read or write command number NUMBER_RD/WR.

The hit profiler 310 may include a register 320 that stores row addresses linked with a same command, a comparator 325 that stores the row addresses stored in the register 320, and a counter 330 that counts read commands or write commands with respect to pages corresponding to a same row address.

Figure 4:
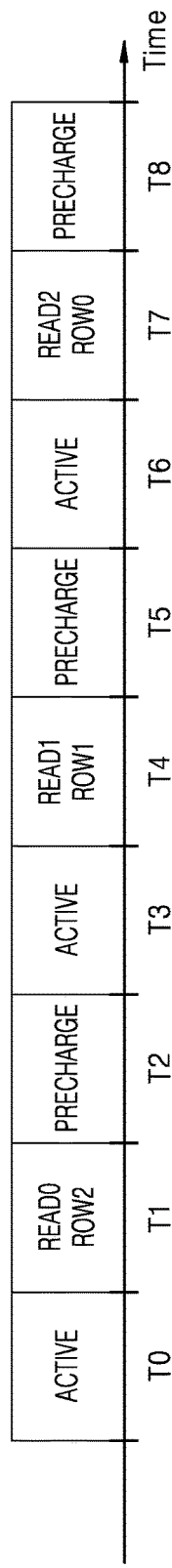
FIGS. 4 and 5 are diagrams for explaining an operation of a hit profiler of FIG. 3, according to at least one example embodiment.

As shown in FIG. 4, meanwhile, it is assumed that the memory controller (112 of FIG. 1) sequentially issues the active command ACTIVE—the read command READ—the precharge command PRECHARGE from a time T0 to a time T8 when issuing the command CMD to the memory device (300 of FIG. 1). It is also assumed that a read command READ1 of a time T4 is provided with a third row address ROW2, a read command READ3 of a time T7 is provided with a second row address ROW1, and a read command READ0 of a time T1 is provided with a first row address ROW0. For convenience of description, a current row address will be considered the first row address ROW0.

The register 320 may store the current row address ROW0 linked with the read command READ and the previous row addresses, for example ROW1 and ROW2. The row addresses ROW0, ROW1, and ROW2 stored in the register 320 may be provided to the comparator 325. The comparator 325 may compare the current row address ROW0 with the one previous row address ROW1 to determine the page hit/miss status, PAGE_HIT/MISS. The page hit status PAGE_HIT may determine that the current row address ROW0 linked with the read command READ and the previous row address ROW1 are the same. The page miss status PAGE_MISS may determine that the current row address ROW0 linked with the read command READ and the previous row address ROW1 are not same.

According to at least one example embodiment, the comparator 325 may compare the current row address ROW0 linked with the read command READ and a plurality of previous row addresses, such as ROW1 and ROW2, to determine the page hit/miss PAGE_HIT/MISS. The page hit PAGE_HIT may determine that the current row address ROW0 linked with the read command READ and the two previous row addresses ROW1 and ROW2 are the same. The page miss PAGE_MISS may determine that the current row address ROW0 linked with the read command READ and the plurality of previous row addresses, such as ROW1 and ROW2 are not same.

According to at least one example embodiment, the register 320 may store a current row address linked with the write command WRITE and previous row addresses, and the comparator 325 may compare the current row address and one previous row address to determine the page hit/miss PAGE_HIT/MISS. According to another example embodiment, the comparator 325 may compare the current row address linked with the write command WRITE and a plurality of previous row addresses to determine the page hit/miss PAGE_HIT/MISS.

Although the register 320 stores the three row addresses ROW0, ROW1, and ROW2 in the present example embodiment, the register 325 may store a row address history configured as three or more various numbers of row addresses. The row address history of the register 320 provides a depth page hit/miss, thereby obtaining a page hit/miss having a high accuracy. The number of row addresses stored in the register 320 may be selectively determined according to a desired precision of the page hit/miss. When the number of row addresses increases, the determined page hit/miss becomes more reliable.

Figure 5:
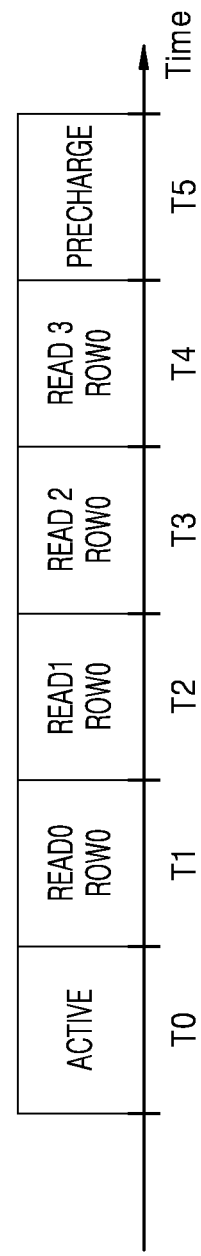

The counter 330 may count the number of read commands READ or the write commands WRITE with respect to pages corresponding to a same row address. For example, it is assumed that as shown in FIG. 5, the memory controller (112 of FIG. 1) issues first through fourth read commands READ0, READ1, READ2, and READ3 from the time T1 to the time T4 between the active command ACTIVE of the time T0 and the precharge command PRECHARGE of the time T5 to the memory device (300 of FIG. 1). It is also assumed that the first through fourth read commands READ0, READ1, READ2, and READ3 are provided with the first row address ROW0.

The counter 330 may count the read commands READ0, READ1, READ2, and READ3 with respect to the first row address ROW0 between the active command ACTIVE and the precharge command PRECHARGE to generate a read command number NUMBER_RD. It may be determined how many read commands are present between the active command ACTIVE and the precharge command PRECHARGE based on the read command number NUMBER_RD. In the present example embodiment, the read command number NUMBER_RD is 4, which reveals that there are four read commands with respect to the first row address ROW0.

According to at least one example embodiment, the counter 330 may count the write commands WRITE with respect to the first row address ROW0 between the active command ACTIVE and the precharge command PRECHARGE to generate a write command number NUMBER_WR. According to another example embodiment, the counter 330 may count the read commands READ or the write commands WRITE with respect to a row address other than the first row address ROW0 to generate the read command number NUMBER_RD or the write command number NUMBER_WR.

The logic circuit unit 340 may determine the page open/close state PAGE_OPEN/CLOSE with respect to a corresponding page based on the page hit/miss PAGE_HIT/MISS of the corresponding page by the hit profiler 310 and the read command number NUMBER_RD or the write command number NUMBER_WR.

If the read command number NUMBER_RD or the write command number NUMBER_WR of the corresponding page is greater than a set and/or desired threshold, the logic circuit unit 340 may determine the page open state PAGE_OPEN, according to at least one example embodiment. If the read command number NUMBER_RD or the write command number NUMBER_WR of the corresponding page is smaller than the threshold, the logic circuit unit 340 may determine the page close state PAGE_CLOSE. When the threshold of the read command number NUMBER_RD or the write command number NUMBER_WR is increased, the precision in which the logic circuit unit 340 determines the page open/close state PAGE_OPEN/CLOSE may subsequently increase. The logic circuit unit 340 may determine the page open state PAGE_OPEN when the corresponding page is determined to be open by performing a read or write operation and may determine the page close state PAGE_CLOSE when the corresponding page is determined to be close by not performing the read or write operation.

Figure 6:
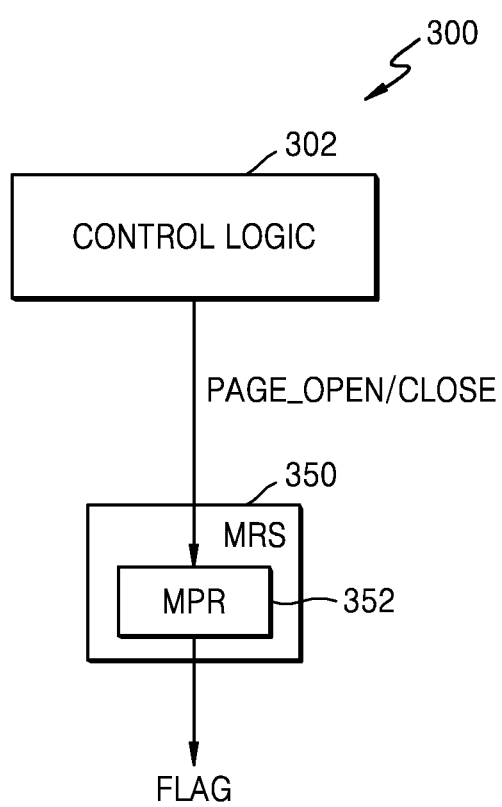
FIG. 6 is a diagram of explaining a part of the memory device of FIG. 1, according to at least one example embodiment.

FIG. 6 is a diagram of explaining a part of the memory device 300 of FIG. 1, according to an example embodiment.

Referring to FIG. 6, the memory device 300 may include a mode register 350 that stores the page open/close state PAGE_OPEN/CLOSE of a corresponding page determined by the control logic unit 302. The mode register (MRS) 350 may provide a plurality of operation options of the memory device 300 and may program various functions, characteristics, and modes of the memory device 300. The mode register 350 may provide a multipurpose register (MPR) 352.

The mode register 350 may store the page open/close state PAGE_OPEN/CLOSE of the corresponding page determined by the control logic unit 302 in the MPR 352. The MPR 352 may store the page open state PAGE_OPEN as, for example, logic high ("1") and the page close state PAGE_CLOSE as logic low ("0"). The MPR 352 of the mode register 350 may be read according to a mode register read command of the memory controller (112 of FIG. 1). The page open/close state PAGE_OPEN/CLOSE stored in the MPR 352 may be output as the flag signal FLAG.

Figure 7:
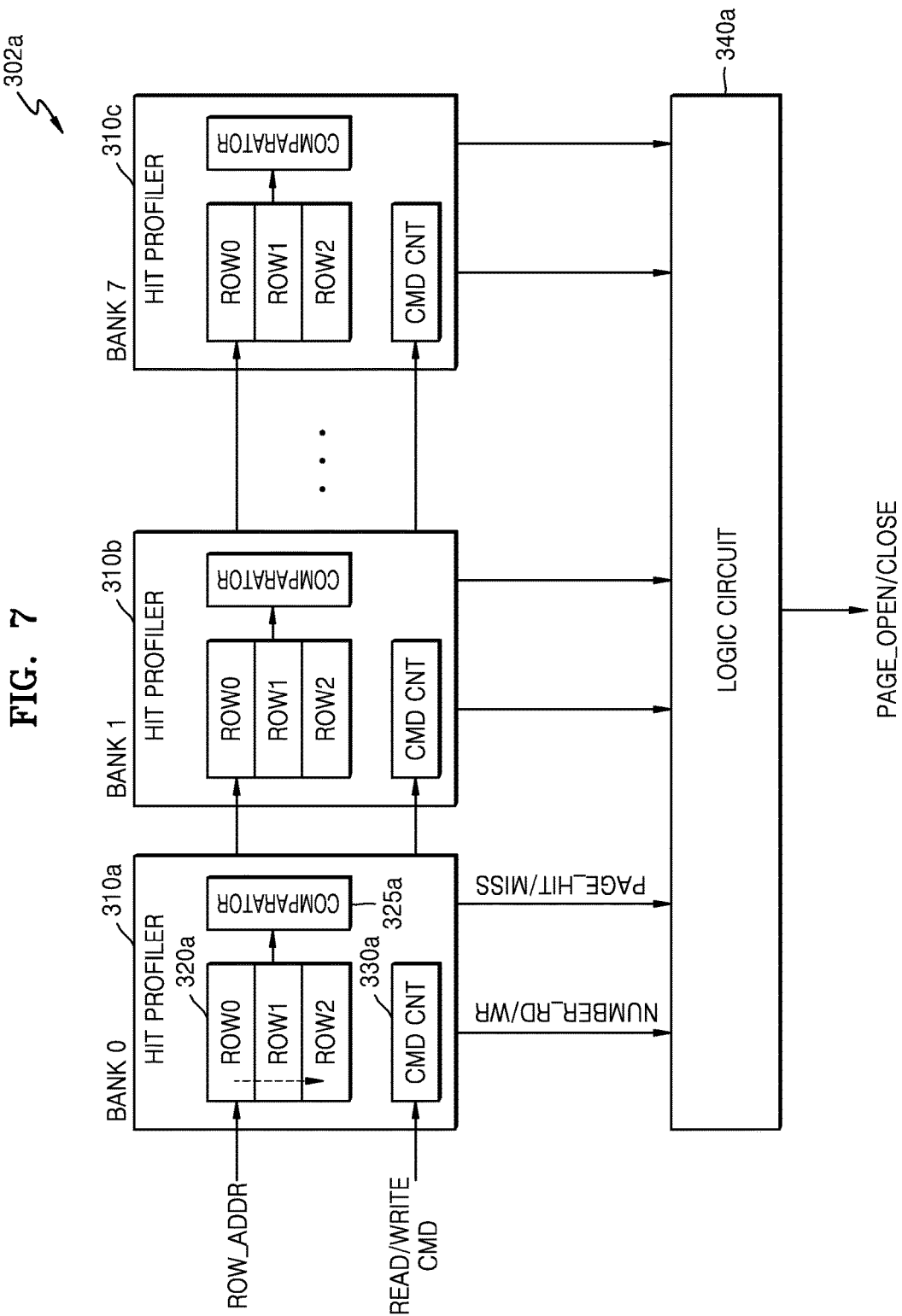
FIG. 7 is a diagram of a second example of explaining the control logic unit included in the memory device of FIG. 1, according to at least one example embodiment.

FIG. 7 is a diagram of a second example embodiment of explaining a control logic unit 302a included in the memory device 300 of FIG. 1. The control logic unit 302a of FIG. 7 includes hit profilers 310a, 310b, . . . , 310c that determine a page open/close state for each bank when the memory cell array (304 of FIG. 1) is configured as a plurality of banks BANK0, BANK1, . . . , BANK7.

Referring to FIG. 7, the control logic unit 302a may include the hit profilers 310a, 310b, . . . , 310c and a logic circuit unit 340a. The hit profilers 310a, 310b, . . . , 310c may respectively correspond to the banks BANK0, BANK1, . . . , BANK7, compare the one or more row addresses ROW_ADDR received along with a same command linked with a corresponding bank, and determine the page hit/miss PAGE_HIT/MISS with respect to a page corresponding to a row address of the corresponding bank. The hit profilers 310a, 310b, . . . , 310c may count the read or write command READ/WRITE with respect to pages corresponding to a same row address of a corresponding bank to generate the read or write command number NUMBER_RD/WR.

The plurality of banks BANK0, BANK1, . . . , BANK7 may include a plurality of memory cells (or pages). For convenience of description, the first hit profiler 310a corresponding to the first bank BANK0 among the plurality of banks BANK0, BANK1, . . . , BANK7 will now be described. A description of the first hit profiler 310 may be applied to the hit profilers 310b, . . . , 310c of the other banks BANK1, . . . , BANK7.

The first hit profiler 310a may include a register 320a, a comparator 325a, and a counter 330a. The register 320a may store row addresses of a same command among row addresses received along with a first bank address that addresses the first bank BANK0. The register 320a may store row addresses ROW1, ROW2, and ROW3 of a command, for example, the read command READ as shown in FIG. 4, with respect to the first bank BANK0. The row addresses ROW1, ROW2, and ROW3 stored in the register 325a may be compared by the comparator 325a. The comparator 325a may compare the current row address ROW1 and the previous row addresses ROW2 and ROW3 to determine the page hit/miss PAGE_HIT/MISS with respect to a page corresponding to the current row address ROW1 of the first bank BANK0.

According to at least one example embodiment, the register 320a may store two or more row addresses linked with the write command WRITE with respect to the first bank BANK0, and the comparator 325a may compare the two or more row addresses to determine the page hit/miss PAGE_HIT/MISS.

The counter 330a may count the read or write command READ/WRITE with respect to pages corresponding to a same row address of the first bank BANK0 to generate a read or write command number. The counter 330a may count, for example, the four read commands READ0, READ1, READ2, and READ3 between the active command ACTIVE and the precharge command PRECHARGE, as shown in FIG. 5, to generate the read command number NUMBER_RD as 4.

According to at least one example embodiment, the counter 330a may count the write commands WRITE with respect to the first row address ROW0 between the active command ACTIVE and the precharge command PRECHARGE to generate the write command number NUMBER_WR.

The first hit profiler 310a may output the page hit/miss PAGE_HIT/MISS and the read command number NUMBER_RD or the write command number NUMBER_WR with respect to the corresponding page of the first bank BANK0. Each of the hit profilers 310b, . . . , 310c may output the page hit/miss PAGE_HIT/MISS and the read command number NUMBER_RD or the write command number NUMBER_WR with respect to a corresponding page of a corresponding bank.

The logic circuit unit 340a may receive the page hit/miss PAGE_HIT/MISS and the read command number NUMBER_RD or the write command number NUMBER_WR with respect to a corresponding page of each of the banks BANK0, BANK1, . . . , BANK7 output from the hit profilers 310a, 310b, . . . 310c, and determine the page open/close state PAGE_OPEN/CLOSE with respect to the corresponding page of each of the banks BANK0, BANK1, . . . , BANK7 based on the received page hit/miss PAGE_HIT/MISS and the read command number NUMBER_RD or the write command number NUMBER_WR.

If the read command number NUMBER_RD or the write command number NUMBER_WR of the corresponding page of each of the banks BANK0, BANK1, . . . , BANK7 is greater than a set and/or desired threshold, the logic circuit unit 340a may determine the page open state PAGE_OPEN.

If the read command number NUMBER_RD or the write command number NUMBER_WR of the corresponding page is smaller than the threshold, the logic circuit unit 340a may determine the page close state PAGE_CLOSE. The greater the threshold of the read command number NUMBER_RD or the write command number NUMBER_WR is set, the higher the precision of the page open/close state PAGE_OPEN/CLOSE of the logic circuit unit 340a may determine.

The logic circuit unit 340a may determine the page open state PAGE_OPEN when the corresponding page of each of the banks BANK0, BANK1, . . . , BANK7 is determined to be open by performing a read or write operation and may determine the page close state PAGE_CLOSE when the corresponding page is determined to be close by not performing the read or write operation.

The page open/close state PAGE_OPEN/CLOSE with respect to the corresponding page of each of the banks BANK0, BANK1, . . . , BANK7 determined by the control logic unit 302a described above may be stored in the MPR 352 of the mode register 350 as shown in FIG. 6. The page open/close state PAGE_OPEN/CLOSE for each of the banks BANK0, BANK1, . . . , BANK7 stored in the MPR 352 may be provided to the memory controller (112 of FIG. 1) as the flag signal FLAG. Accordingly, the memory controller (112 of FIG. 1) may refer to the page open/close state PAGE_OPEN/CLOSE to establish a page open/close policy for each of the banks BANK0, BANK1, . . . , BANK7.

Figure 8:
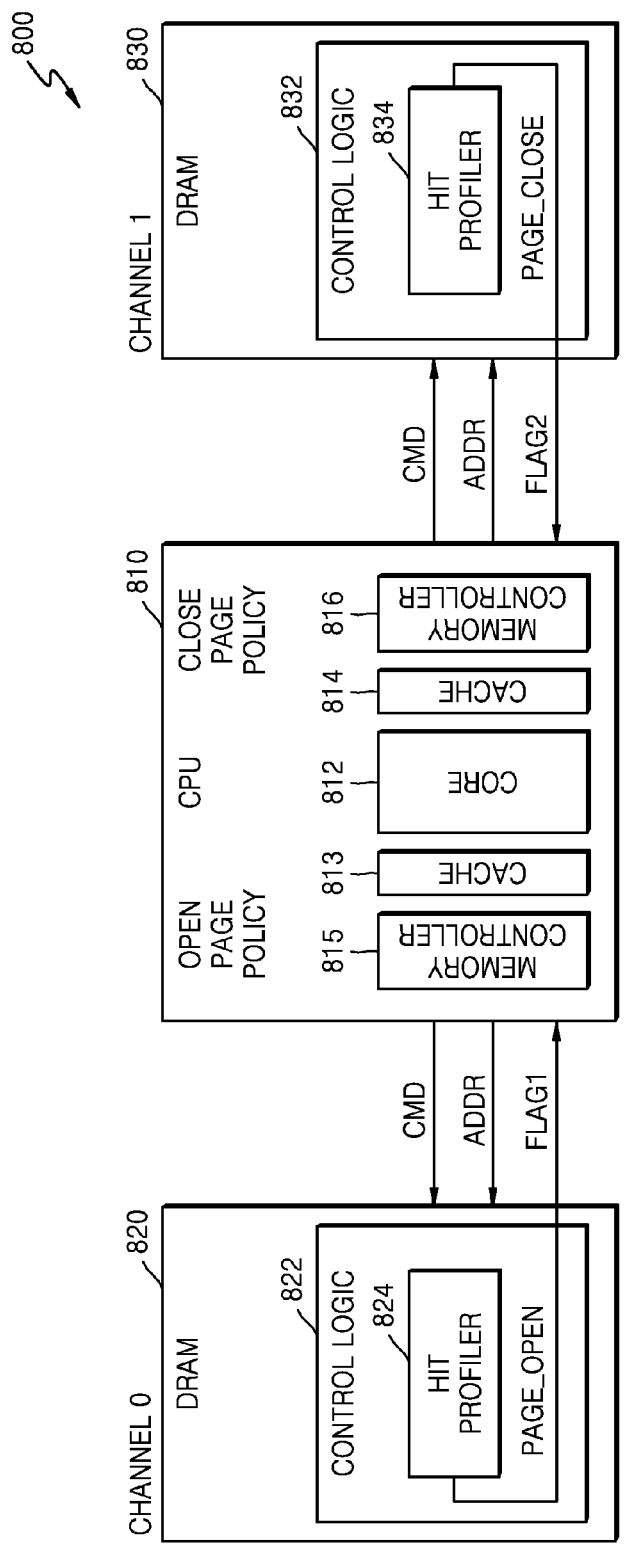
FIG. 8 is a diagram of a second example of explaining a system including memory devices for performing a pages state informing function, according to at least one example embodiment.

FIG. 8 is a diagram of a second example of explaining a system 800 including memory devices 820 and 830 for performing a pages state informing function, according to an example embodiment. Referring to FIG. 8, each of the memory devices 820 and 830 may be configured as a channel of an independent interface.

Referring to FIG. 8, the system 800 may include a processor 810 and the memory devices 820 and 830 configured as two channels CHANNEL0 and CHANNEL1, but is not limited thereto and may include more memory devices.

The processor 810 may include a core 812 that performs a multiprocessor function, first and second caches 813 and 814, and first and second memory controllers 815 and 816. The first and second caches 813 and 814 may have data of a frequently used address in the memory devices 820 and 830 so as to reduce an access time of the memory devices 820 and 830. The core 812 may inspect whether data corresponding to the address is present in the first or second cache 813 or 814 when reading or writing the memory device 820 or 830.

If the data corresponding to the address is present in the first or second cache 813 or 814, the core 812 may directly read the data from the first or second cache 813 or 814. If not, the core 812 may directly access the data from the memory device 820 or 830. The core 812 may copy the data transmitted by directly accessing the memory device 820 or 830 to the first or second cache 813 or 814. The core 812 may directly read and write the data from and to the first or second cache 813 or 814 when accessing the memory device 820 or 830 of a same address next time.

Each of the first and second memory controllers 815 and 816 may support a read and/or write memory transaction to allow the core 812 to access the memory device 820 or 830.

The first memory device 820 of the first channel CHANNEL0 may include a first control logic unit 822 that receives the command CMD and the address ADDR from the first memory controller 815. The first control logic unit 822 may include a hit profiler 824 that analyzes the command CMD and the address ADDR and determine the page open/close state PAGE_OPEN/CLOSE with respect to at least one page included in a memory cell array. The hit profiler 824 of the first control logic unit 822 may compare one or more row addresses received along with a same command, count commands with respect to pages corresponding to a same row address, determine a page hit/miss with respect to the corresponding page, and generate a read or write command number.

The first control logic unit 822 may determine the page open/close state PAGE_OPEN/CLOSE with respect to the corresponding page based on the page hit/miss and the read or write command number with respect to the corresponding page by the hit profiler 824. The first memory device 820 may generate a first flag signal FLAG1 according to the page open/close state PAGE_OPEN/CLOSE of the corresponding page.

The first control logic unit 822 may determine the page open state PAGE_OPEN based on the page hit and a read or write command number greater than a threshold with respect to the corresponding page. The first memory device 820 may generate the first flag signal FLAG1 as logic high ("1") according to the page open state PAGE_OPEN of the corresponding page. According to at least one example embodiment, when the corresponding page is determined as the page close state PAGE_CLOSE, the first memory device 820 may generate the first flag signal FLAG1 as logic low ("0").

The first memory device 820 may transfer the first flag signal FLAG1 to the first memory controller 815 through the DQ line or through a separate signal line. The first memory controller 815 may establish a page policy with respect to the first memory device 820 by referring to the first flag signal FLAG1. The first memory controller 815 may establish a page open policy PAGE OPEN POLICY with respect to the corresponding page of the first memory device 820 by referring to the logic high ("1") first flag signal FLAG1 indicating the page open state PAGE_OPEN.

The second memory device 830 of the second channel CHANNEL1 may include a second control logic unit 832 that receives the command CMD and the address ADDR from the second memory controller 816. The second control logic unit 832 may include a hit profiler 834 that analyzes the command CMD and the address ADDR and determine the page open/closed state PAGE_OPEN/CLOSE with respect to at least one page included in the memory cell array. The hit profiler 834 of the second control logic unit 832 may compare one or more row addresses received along with the same command, count commands with respect to pages corresponding to the same row address, determine the page hit/miss with respect to the corresponding page, and generate the read or write command number.

The second control logic unit 832 may determine the page open/close state PAGE_OPEN/CLOSE with respect to the corresponding page based on the page hit/miss and the read or write command number with respect to the corresponding page by the hit profiler 834. The second memory device 830 may generate a second flag signal FLAG2 according to the page open/close state PAGE_OPEN/CLOSE of the corresponding page.

The second control logic unit 832 may determine the page open state PAGE_OPEN based on the page hit and a read or write command number greater than the threshold with respect to the corresponding page. The second memory device 830 may generate the second flag signal FLAG2 as logic low ("0") according to the page close state PAGE_CLOSE of the corresponding page. According to at least one example embodiment, when the corresponding page is determined as the page open state PAGE_OPEN, the second memory device 830 may generate the second flag signal FLAG2 as logic high ("1").

The second memory device 830 may transfer the second flag signal FLAG2 to the second memory controller 816 through the DQ line or through a separate signal line. The second memory controller 816 may establish a page policy with respect to the second memory device 830 by referring to the second flag signal FLAG2. The second memory controller 816 may establish a page close policy PAGE CLOSE POLICY with respect to the corresponding page of the second memory device 830 by referring to the logic low ("0") second flag signal FLAG2 indicating the page close state PAGE_CLOSE.

The processor 810 may establish and/or implement a page management policy by referring to the first flag signal FLAG1 of the page open state PAGE_OPEN output from the first memory device 820 and the second flag signal FLAG2 of the page close state PAGE_CLOSE output from the second memory device 830. Accordingly, the processor 810 may establish and/or implement different page policies with respect to the channels CHANNEL0 and CHANNEL1.

Figure 9:
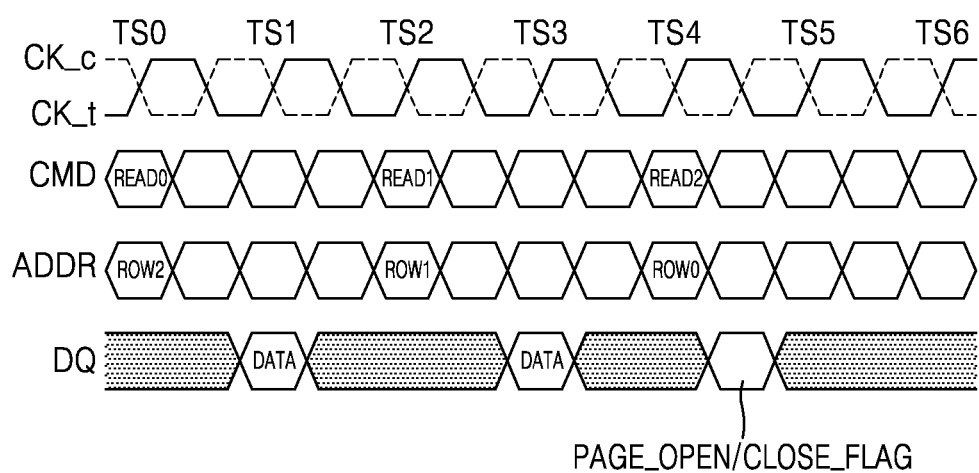
FIGS. 9 and 10 are timing diagrams of explaining a transmission of a flag signal in a page open/close state in the systems of FIGS. 1 and 8, according to at least one example embodiment.
Figure 10:
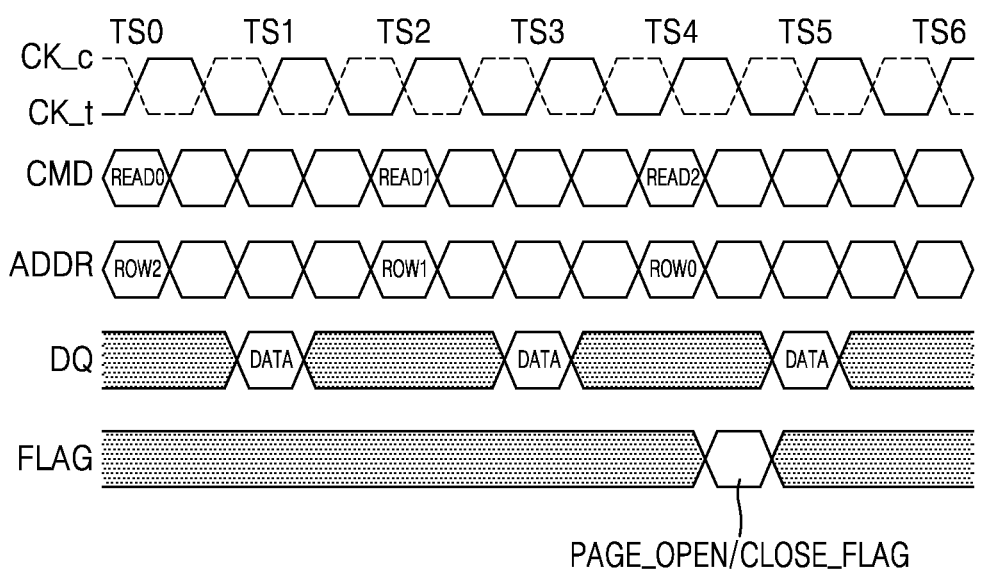

FIGS. 9 and 10 are timing diagrams of explaining a transmission of a flag signal in the page open/close state PAGE_OPEN/CLOSE in the systems 100 and 800 of FIGS. 1 and 8. FIG. 9 shows a method of transmitting the flag signal FLAG indicating the page open/close state PAGE_OPEN/CLOSE of the memory devices 400, 820, and 830 through a DQ line of each of the memory devices 400, 820, and 830. FIG. 10 shows a method of transmitting the flag signal FLAG indicating the page open/close state PAGE_OPEN/CLOSE of the memory devices 400, 820, and 830 through a dedicated pin of the flag signal FLAG.

Referring to FIGS. 1 and 9, the memory controller 112 may transmit the command CMD and the address ADDR to the memory device 300 in accordance with a rise edge and/or a fall edge of differential clocks CK_t and CL_c. The memory controller 112 may transmit the third row address ROW2, for example, to which the first read command READ0 is to be performed at a time slot time TS0 to the memory device 300. A time slot may be set as a time section in which a read operation is performed. Data of the third row address ROW2 may be output at a time slot time TS1. The second read command READ1 and the second row address ROW1 may be transmitted at a time slot time TS2. Data of the second row address ROW1 may be output at a time slot time TS3. The third read command READ2 and the first row address ROW0 may be transmitted at a time slot time TS4.

The memory device 300 may compare the row addresses ROW0, ROW1, and ROW2 received along with the read commands READ0, READ1, and READ2. The memory device 300 may determine the page open state PAGE_OPEN when the first row address ROW0 is the same as the second and/or row addresses ROW1 and ROW2 and may determine the page close state PAGE_CLOSE when the first row address ROW0 is not the same as the second and/or row addresses ROW1 and ROW2. The memory device 300 may transmit the page open/close state PAGE_OPEN/CLOSE of a page corresponding to the first row address ROW0 to the memory controller 112 as a flag signal PAGE_OPEN/CLOSE_FLAG through the DQ line 126.

Referring to FIG. 10, the memory device 300 may transmit the page open/close state PAGE_OPEN/CLOSE of a page corresponding to the first row address ROW0 received along the read command READ3 to the memory controller 112 as the flag signal PAGE_OPEN/CLOSE_FLAG through a flag signal line FLAG.

Figure 11:
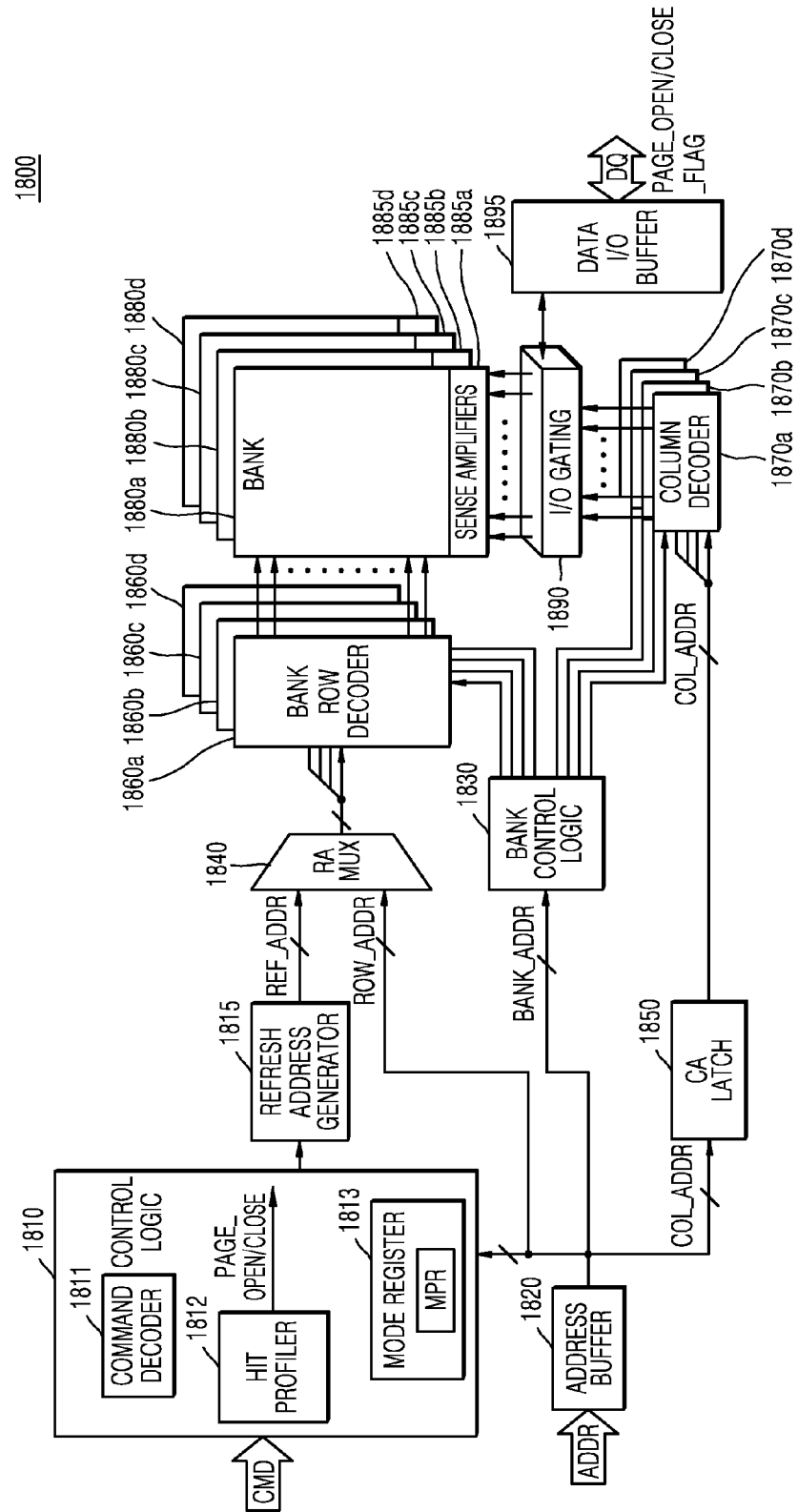
FIG. 11 is a diagram of explaining a memory device for performing a page state informing function, according to at least one example embodiment.

FIG. 11 is a diagram of explaining a memory device 1800 for performing a page state informing function, according to an example embodiment.

Referring to FIG. 11, the memory device 1800 may include a control logic 1810, a refresh address generating unit 1815, an address buffer 1820, a bank control logic 1830, a row address multiplexer 1840, a column address latch 1850, a row decoder, a memory cell array, a sense amplifying unit, an input/output gating circuit 1890, and a data input/output buffer 1895.

A memory cell region may include a plurality of bank arrays, for example first through fourth bank arrays 1880a, 1880b, 1880c, and 1880d. Each of the first through fourth bank arrays 1880a, 1880b, 1880c, and 1880d may include a plurality of memory cell rows (or pages), and may include a plurality of sense amplifiers, for example 1885a, 1885b, 1885c, and 1885d that sense and amplify memory cells connected to the memory cell rows.

The row decoder may include row decoders, such as first through fourth bank row decoders 1860a, 1860b, 1860c, and 1860d that are respectively connected to the first through fourth bank arrays 1880a, 1880b, 1880c, and 1880d. The column decoder may include bank column decoders, such as first through fourth bank column decoders 1870a, 1870b, 1870c, and 1870d that are respectively connected to the first through fourth bank arrays 1880a, 1880b, 1880c, and 1880d.

The first through fourth bank arrays 1880a, 1880b, 1880c, and 1880d, the first through fourth bank row decoders 1860a, 1860b, 1860c, and 1860d, and the first through fourth bank column decoders 1870a, 1870b, 1870c, and 1870d may constitute first through fourth memory banks. Although the memory device 1800 includes four memory banks in FIG. 11, according to at least one example embodiment, the memory device 1800 may include an arbitrary number of memory banks.

According to at least one example embodiment, the memory device 1800 may be a memory device such as a dynamic random access memory (DRAM) device, a double data rate (DDR) SDRAM device, a low power double data rate (LPDDR) SDRAM device, a graphics double data rate (GDDR) SDRAM device, a rambus dynamic random access memory (RDRAM) device, etc.

The control logic 1810 may control an operation of the memory device 1800. For example, the control logic 1810 may generate control signals to allow the memory device 1800 to perform a write operation or a read operation. The control logic 1810 may include a command decoder 1811 that decodes the command CMD received from a memory controller, a hit profiler 1812 that determines the page open/close state PAGE_OPEN/CLOSE with respect to at least one page included in the first through fourth bank arrays 1880a, 1880b, 1880c, and 1880d, and a mode register 1813 that sets an operation mode of the memory device 1800.

The command decoder 1811 may decode a write enable signal /WE, a row address strobe signal /RAS, a column address strobe signal /CAS, a chip selection signal /CS, etc., to generate control signals corresponding to the command CMD. The command CMD may include an active command, a read command, a write command, a precharge command, etc.

The hit profiler 1812 may compare one or more row addresses received along with a same command with respect to a corresponding bank and, as a method of counting commands with respect to pages corresponding to a same row address, may analyze the command CMD and the address ADDR. The hit profiler 1812 may determine a page hit or miss (hit/miss) with respect to a corresponding page of the corresponding bank according to an analyzed result and may generate a read or write command number.

The control logic 1810 may determine the page open/close state PAGE_OPEN/CLOSE with respect to the corresponding page of the corresponding bank based on the page hit/miss or the read or write command number by the hit profiler 1812.

The mode register 1813 may provide a plurality of operation options of the memory device 1800 and may program various functions, characteristics, and modes of the memory device 1800. The mode register 1813 may store the page open/close state PAGE_OPEN/CLOSE of the corresponding page determined by the control logic 1810 in an MPR. A signal stored in the MPR may be output as the page open/close state PAGE_OPEN/CLOSE through a DQ pin or through a dedicate pin.

The control logic 1810 may further include the differential clocks CK_t and CL_c and a clock enable signal CKE for driving the memory device 1800 in a synchronization manner. Data of the memory device 1800 may operate at a double data rate. The clock enable signal CKE may be captured at a rise edge of the differential clock CK_t.

The control logic 1810 may control the refresh address generating unit 1815 to perform an auto refresh operation in response to a refresh command or a self-refresh operation in response to a self-refresh entrance command.

The refresh address generating unit 1815 may generate a refresh address REF_ADDR corresponding to a memory cell array to which a refresh operation is to be performed. The refresh address generating unit 1815 may generate the refresh address REF_ADDR at a refresh cycle defined in the standard of a volatile memory device.

The address buffer 1820 may receive the address ADDR including a bank address BANK_ADDR, a row address ROW_ADDR, and a column address COL_ADDR form the memory controller. The address buffer 1820 may provide the received bank address BANK_ADDR to the bank control logic 1830, the received row address ROW_ADDR to the row address multiplexer 1840, and the received column address COL_ADDR to the column address latch 1850.

The bank control logic 1830 may generate bank control signals in response to the bank address BANK_ADDR. In response to the bank control signals, a bank row decoder corresponding to the bank address BANK_ADDR among the first through fourth bank row decoders 1860a, 1860b, 1860c, and 1860d may be activated, and a bank column decoder corresponding to the bank address BANK_ADDR among the first through fourth bank column decoders 1870a, 1870b, 1870c, and 1870d may be activated.

The bank control logic 1830 may generate bank group control signals in response to the bank address BANK_ADDR that determines a bank group. In response to the bank group control signals, row decoders of a bank group corresponding to the bank address BANK_ADDR among the first through fourth bank row decoders 1860a, 1860b, 1860c, and 1860d may be activated, and column decoders of a bank group corresponding to the bank address BANK_ADDR among the first through fourth bank column decoders 1870a, 1870b, 1870c, and 1870d may be activated.

The row address multiplexer 1840 may receive the row address ROW_ADDR from the address buffer 1820 and receive the refresh address REF_ADDR from the refresh address generating unit 1815. The row address multiplexer

1840 may selectively output the row address ROW_ADDR or the refresh address REF_ADDR. The row address ROW_ADDR output by the row address multiplexer 1840 may be applied to each of the first through fourth bank row decoders 1860*a*, 1860*b*, 1860*c*, and 1860*d*.

The bank row decoder activated by the bank control logic 1830 among the first through fourth bank row decoders 1860*a*, 1860*b*, 1860*c*, and 1860*d* may decode the row address ROW_ADDR output by the row address multiplexer 1840 and activate a word line corresponding to the row address ROW_ADDR. For example, the activated bank row decoder may apply a word line driving voltage to the word line corresponding to the row address ROW_ADDR.

The column address latch 1850 may receive the column address COL_ADDR from the address buffer 1820 and temporarily store the received column address COL_ADDR. The column address latch 1850 may gradually increase the column address COL_ADDR received in a bust mode. The column address latch 1850 may apply the temporarily stored or gradually increased column address COL_ADDR to each of the first through fourth bank column decoders 1870*a*, 1870*b*, 1870*c*, and 1870*d*.

The bank column decoder activated by the bank control logic 1830 among the first through fourth bank column decoders 1870*a*, 1870*b*, 1870*c*, and 1870*d* may activate a sense amplifier corresponding to the bank address BANK_ADDR and the column address COL_ADDR through the input/output gating circuit 1890.

The input/output gating circuit 1890 may include, along with circuits that gate input/output data, an input data mask logic, read data latches for storing data output from the first through fourth bank arrays 1880*a*, 1880*b*, 1880*c*, and 1880*d*, and a write driver for writing the data to the first through fourth bank arrays 1880*a*, 1880*b*, 1880*c*, and 1880*d*.

Write data that is to be written to a memory cell array of one of the first through fourth bank arrays 1880*a*, 1880*b*, 1880*c*, and 1880*d* may be provided to the data input/output buffer 1895 through a memory buffer from the memory controller. The data provided to the data input/output buffer 1895 may be written to one of the first through fourth bank arrays 1880*a*, 1880*b*, 1880*c*, and 1880*d* through the write driver.

Figure 12:
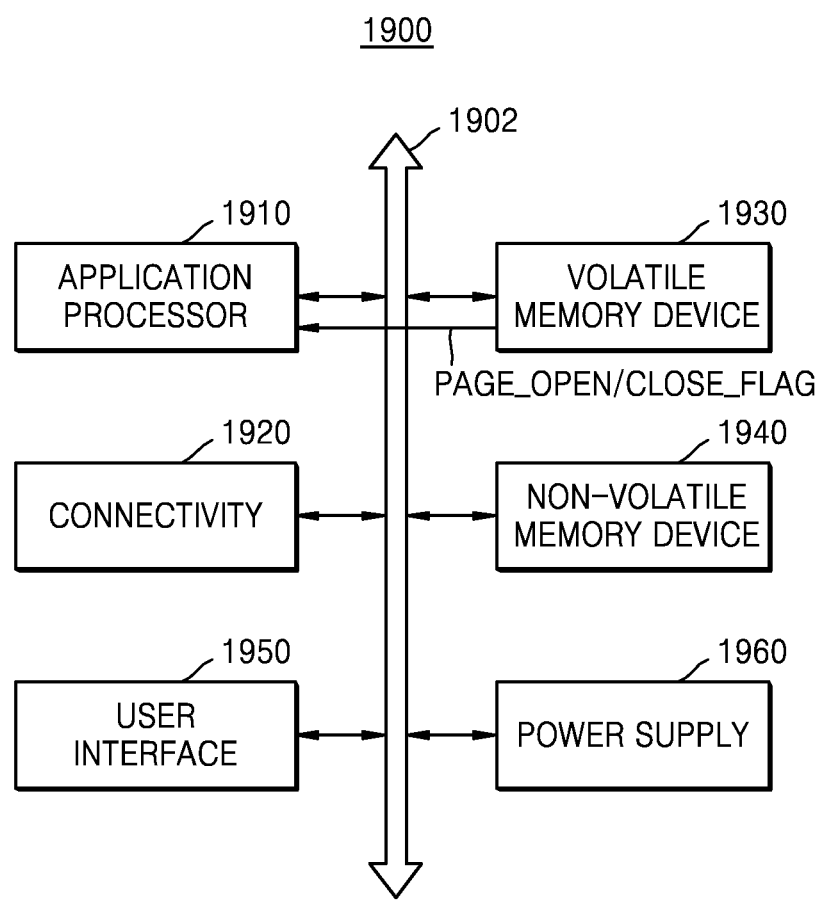
FIG. 12 is a block diagram of an example of a mobile system to which a memory device for performing a page state informing function is applied, according to at least one example embodiment.

FIG. 12 is a block diagram of an example of a mobile system 1900 to which a memory device for performing a page state informing function is applied, according to some example embodiments.

Referring to FIG. 12, the mobile system 1900 may include an application processor 1910, a connectivity unit 1920, a first memory device 1930, a second memory device 1940, a user interface 1950, and a power supply source 1960, which are connected to each other via a bus 1902. The first memory device 1930 may be a volatile memory device, and the second memory device 1940 may be a nonvolatile memory device. According to at least one example embodiment, the mobile system 1900 may be an arbitrary mobile system, such as a mobile phone, a smartphone, a personal digital assistant (PDA), a portable multimedia player (PMP), a digital camera, a music player, a portable game console, a navigation system, etc.

The application processor 1910 may execute applications that provide an Internet browser, a game, a video, etc. According to at least one example embodiment, the application processor 1910 may include a single core processor or a multi-core processor. For example, the application processor 1910 may include a dual-core processor, a quad-core processor, a hexa-core processor, etc. Additionally, the application processor 1910 may be a multi-processor system, a distributed processor system, etc. According to at least one example embodiment, the application processor 1910 may further include an internal or external cache memory.

The connectivity unit 1920, (i.e., a communications transceiver) may perform wireless communication or wired communication with an external apparatus. For example, the connectivity unit 1920 may perform Ethernet communication, near field communication (NFC), radio frequency identification (RFID) communication, mobile telecommunication, memory card communication, universal serial bus (USB) communication, etc. For example, the connectivity unit 1920 may include a baseband chipset, and may support communication, such as global system for mobile communication (GSM), gross rating points (GRPS), wideband code division multiple access (WCDMA), or high speed packet access (HSxPA).

The first memory device 1930 that is a volatile memory device may store data processed by the application processor 1910 or may operate as a working memory. The first memory device 1930 may determine a page hit/miss with respect to a page of a corresponding row address and generate a read or write command number as a method of comparing one or more row addresses received along with a same command from the application processor 1910 and counting commands with respect to a page corresponding to a same row address. The first memory device 1930 may determine a page open/close state with respect to a corresponding page based on the page hit/miss and the read or write command number and transfer the page open/close state to the application processor 1910 as a flag signal. The application processor 1910 may establish and/or implement a page open/close policy with respect to the corresponding page by referring to the flag signal indicating the page open/close state. The memory device 1930 may be configured as a plurality of channels including independent interfaces. The application processor 1910 may establish and/or implement different page open/close policies for each channel.

The second memory device 1940 that is a nonvolatile memory device may store a boot image for booting the mobile system 1900. For example, the second memory device 1940 may be electrically erasable programmable read-only memory (EEPROM), a flash memory, phase change random access memory (PRAM), resistance random access memory (RRAM), nano-floating gate memory (NFGM), polymer random access memory (PoRAM), magnetic random access memory (MRAM), ferroelectric random access memory (FRAM), or a memory similar thereto.

The user interface 1950 may include at least one input device, such as a keypad or a touch screen, and/or at least one output device, such as a speaker or a display device. The power supply source 1960 may supply an operation voltage. According to at least one example embodiment, the mobile system 1900 may further include a camera image processor (CIP), and may further include a storage device, such as a memory card, a solid state drive (SSD), a hard disk drive (HDD), a CD-ROM, etc.

Figure 13:
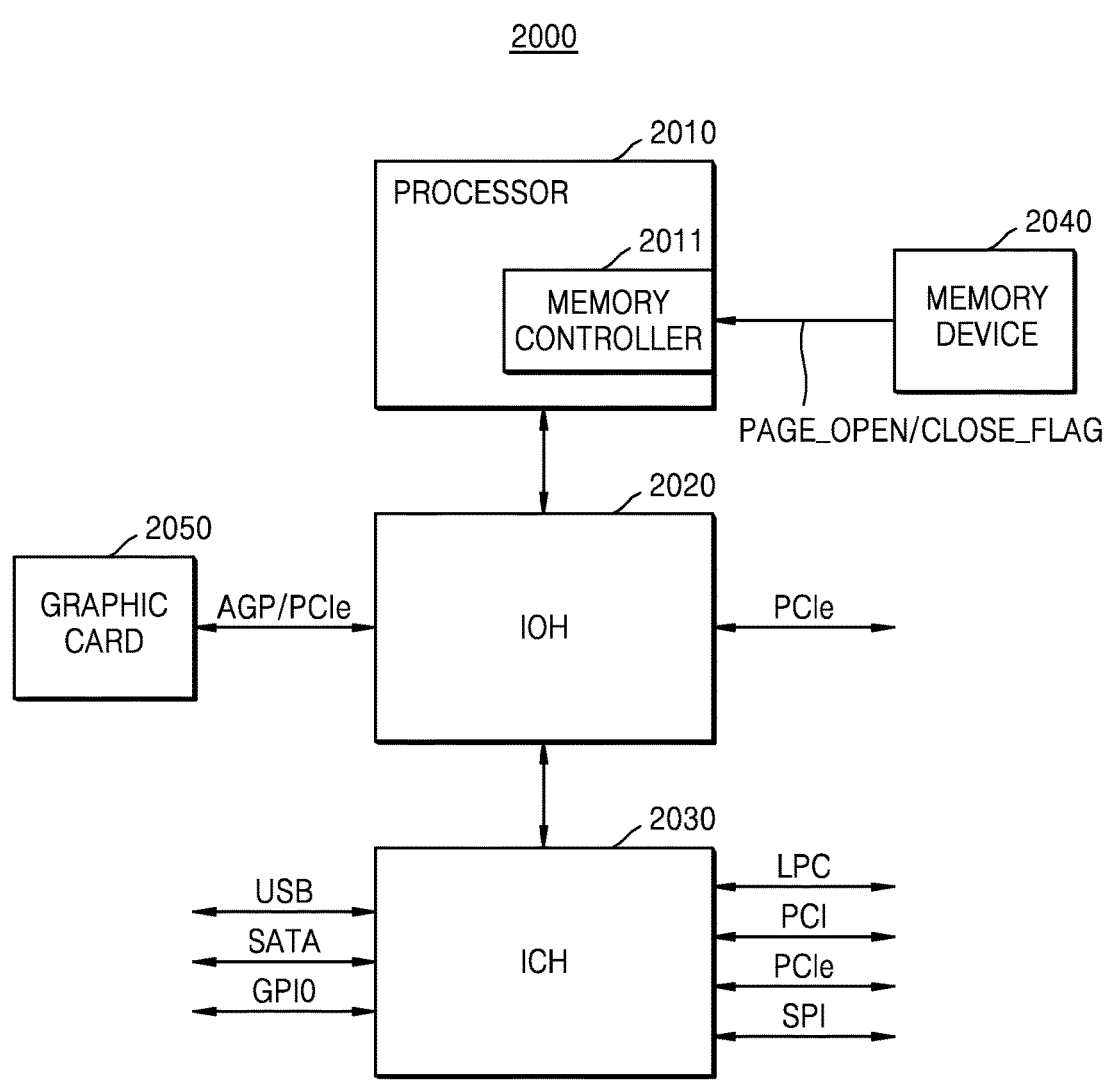
FIG. 13 is a block diagram of an example of a computing system to which a memory device for performing a page state informing function is applied, according to at least one example embodiment.

FIG. 13 is a block diagram of an example of a computing system 2000 to which a memory device for performing a page state informing function is applied, according to some example embodiments.

Referring to FIG. 13, the computing system 2000 includes a processor 2010, an I/O hub (IOH) 2020, an I/O controller hub (ICH) 2030, a memory device 2040, and a graphics card 2050. According to at least one example embodiment, the computing system 2000 may be an arbitrary computing system, such as a personal computer (PC), a server computer, a workstation, a laptop, a mobile phone, a smartphone, a PDA, a PMP, a digital camera, a digital television (DTV), a set-top box, a music player, a portable game console, a navigation system, etc.

The processor 2010 may execute various computing functions, such as certain calculations or tasks. For example, the processor 2010 may be a microprocessor or a central processing unit (CPU). According to at least one example embodiment, the processor 2010 may include a single core processor or a multi-core processor. For example, the processor 2010 may include a dual-core processor, a quad-core processor, a hexa-core processor, etc. In FIG. 13, the computing system 2000 includes one processor 2010, but according to some example embodiments, the computing system 2000 may include a plurality of processors 2010. According to at least one example embodiment, the processor 2010 may further include an internal or external cache memory.

The processor 2010 may include a memory controller 2011 that controls operations of the memory device 2040. The memory controller 2011 included in the processor 2010 may be referred to as an integrated memory controller (IMC). According to at least one example embodiment, the memory controller 2011 may be disposed inside the IOH 2020. The IOH 2020, including the memory controller 2011, may be referred to as a memory controller hub (MCH).

The memory device 2040 may determine a page hit/miss with respect to a page of a corresponding row address and generate a read or write command number as a method of comparing one or more row addresses received along with a same command from the memory controller 2011 and counting commands with respect to a page corresponding to a same row address. The memory device 2040 may determine a page open/close state with respect to a corresponding page based on the page hit/miss and the read or write command number and transfer the page open/close state to the memory controller 2011 as a flag signal. The memory controller 2011 may establish and/or implement a page open/close policy with respect to the corresponding page by referring to the flag signal indicating the page open/close state. The memory device 2040 may be configured as a plurality of channels including independent interfaces. The memory controller 2011 may establish and/or implement different page open/close policies for each channel.

The IOH 2020 may manage data transmission between apparatuses, such as the graphics card 2050, and the processor 2010. The IOH 2020 may be connected to the processor 2010 via any type of interface. For example, the IOH 2020 and the processor 2010 may be connected to each other via an interface according to any of various standards, such as a front side bus (FSB), a system bus, a HyperTransport, a lighting data transport (LDT), a quick pth interconnect (QPI), a common system interface, and peripheral component interface-express (CSI). In FIG. 13, the computing system 2000 includes one IOH 2020, but according to some example embodiments, the computing system 2000 may include a plurality of the IOHs 2020.

The IOH 2020 may provide various interfaces with apparatuses. For example, the IOH 2020 may provide an accelerated graphics port (AGP) interface, a peripheral component interface-express (PCIe) interface, a communication streaming architecture (CSA) interface, etc.

The graphics card 2050 may be connected to the IOH 2020 through AGP or PCIe. The graphics card 2050 may control a display device (not shown) for displaying an image. The graphics card 2050 may include an internal processor and an internal semiconductor memory device for processing image data. According to at least one example embodiment, the IOH 2020 may include a graphics device therein together with or instead of the graphics card 2050 disposed outside the IOH 2020. The graphics device included in the IOH 2020 may be referred to as integrated graphics. The IOH 2020, including a memory controller and a graphics device, may be referred to as a graphics and memory controller hub (GMCH).

The ICH 2030 may perform data buffering and interface arbitration such that various system interfaces efficiently operate. The ICH 2030 may be connected to the IOH 2020 through an internal bus. For example, the IOH 2020 and the ICH 2030 may be connected to each other via a direct media interface (DMI), a hub interface, an enterprise Southbridge interface (ESI), PCIe, etc.

The ICH 2030 may provide various interfaces with peripheral devices. For example, the ICH 2030 may provide a USB port, a serial advanced technology attachment (SATA) port, a general purpose I/O (GPIO), a low pin count (LPC) bus, a serial peripheral interface (SPI), PCI, PCIe, etc.

According to at least one example embodiment, two or more of the processor 2010, the IOH 2020, and the ICH 2030 may be implemented in one chipset.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A memory device comprising:
   a memory cell array comprising a plurality of pages addressed by row address; and
   a control logic unit configured to
      determine whether at least one page among the plurality of pages is in an open state or a closed state, based on a command and the row address of the at least one page, the determination includes,
         generating results based on at least two row addresses received along with the command,
         generating a page hit or a page miss based on the results, and
         determining, according to the page hit or the page miss, whether each of the plurality of pages is in the open state or the closed state, and
      output a flag signal indicating whether the at least one page is in the open state or the closed state.

2. The memory device of claim 1, wherein the control logic unit is configured to
   count read or write commands with respect to a page corresponding to a row address; and
   determine, according to a read or write command number generated based on the counting, whether each of the plurality of pages is in the open state or the closed state.

3. The memory device of claim 1, wherein the control logic unit comprises:
   a register configured to store one or more row addresses received along with a command;

a comparator configured to generate results based on at least two of the row addresses stored in the register and generate a page hit or a page miss;
a counter configured to count read or write commands with respect to a page corresponding to a row address and generate a read or write command number; and
a logic circuit unit configured to determine, based on the page hit or page miss and the read or write command number, whether each of the plurality of pages is in the open state or the closed state.

4. The memory device of claim 1, wherein,
the memory cell array is configured as one or more banks comprising the plurality of pages;
the control logic unit further comprises a hit profiler corresponding to each of the one or more banks; and
each hit profiler is configured to determine whether each of the plurality of pages of a bank corresponding to said hit profiler is in the open state or the closed state.

5. The memory device of claim 4, wherein each hit profiler comprises:
a register configured to store one or more row addresses received along with a command associated with the bank corresponding to said hit profiler;
a comparator configured to generate results based on the one or more row addresses stored in the register and generate a page hit or a page miss;
a counter configured to count read or write commands with respect to a page corresponding to a same row address associated with the corresponding bank and generate a read or write command number; and
the control logic unit further comprises a logic circuit unit configured to determine whether the page corresponding to the same row address associated with the corresponding bank are in the open state or the closed state, based on the page hit or the page miss and the generated read or write command number.

6. The memory device of claim 1, wherein the page open state or the closed state is stored in a multipurpose register (MPR) of a mode register of the memory device.

7. The memory device of claim 6, wherein the flag signal is output according to a mode register read command.

8. A method of operating a memory device comprising a plurality of pages addressed by row addresses, the method comprising:
receiving a command and the row addresses;
determining a page open/close state with respect to the plurality of pages based on the command and the row addresses, the determining including,
generating results based on two or more row addresses received along with the command,
generating a page hit or miss based on the results, and
determining the page open/close state according to the page hit or miss; and
outputting a flag signal, the flag signal indicating the page open/close state.

9. The method of claim 8, wherein the number of the row addresses to be compared is determined according to a desired precision of the generating the page hit or page miss.

10. The method of claim 8, wherein the determining of the page open/closed state comprises:
counting read or write commands with respect to pages corresponding to a row address; and
determining the page open/close state according to a read or write command number generated as a result of the counting.

11. The method of claim 8, wherein the memory comprises one or more banks comprising the plurality of pages, the method further comprising:
determining the page open/close state with respect to the plurality of pages of a corresponding bank among the one or more banks.

12. The method of claim 11, wherein the determining of the page open/close state comprises:
generating results based on one or more row addresses received along with a command associated with the corresponding bank; and
determining the page open/close state with respect to the plurality of pages of the corresponding bank according to a page hit or miss generated based on the results.

13. The method of claim 11, wherein the determining of the page open/close state comprises:
counting read or write commands with respect to the plurality of pages corresponding to a same row address associated with the corresponding bank; and
determining the page open/close state with respect to the plurality of pages of the corresponding bank according to a read or write command number generated as a result of the counting.

14. A system comprising:
at least one processor configured to read or write (R/W) data to a memory address;
at least one memory controller configured to access at least one memory device in accordance to a R/W command from the processor; and
the memory device configured to determine a page state for a page associated with the R/W command, the page state indicating whether the page is in an open or closed stated, the determination including,
generating results based on two or more memory addresses received along with the R/W command,
generating a page hit or miss based on the results, and
determining the page state according to the page hit or miss.

15. The system of claim 14, wherein the memory device includes:
a control logic configured to,
receive the R/W command from the memory controller, the R/W command including a memory address,
determine the page state by determining whether the memory address corresponds to an open page in the memory device, and
generate a signal indicating the page state.

16. The system of claim 15, wherein
the received R/W command includes a plurality of memory addresses; and
the control logic is configured to determine the page state by,
counting a number of the plurality of memory addresses that correspond to the open page in the memory device,
determining whether the number is greater than a desired threshold number, and
generating the signal indicating the page state based on the determining.

17. The system of claim 14, wherein
the memory controller includes a plurality of memory controllers;
the memory device includes a plurality of memory devices; and
the plurality of memory devices are each configured to operate as a memory channel.

18. The system of claim 17, wherein each of the memory controllers is configured to set a page policy for a respective one of the memory devices.

* * * * *